(12) United States Patent
Kim et al.

(10) Patent No.: US 9,825,082 B2
(45) Date of Patent: Nov. 21, 2017

(54) PIXEL AMPLIFICATION APPARATUS, CMOS IMAGE SENSOR INCLUDING THE SAME AND OPERATION METHOD THEREOF

(71) Applicant: SK hynix Inc., Gyeonggi-do (KR)

(72) Inventors: Tae-Hoon Kim, Gyeonggi-do (KR); Woong-Hee Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 176 days.

(21) Appl. No.: 14/850,624

(22) Filed: Sep. 10, 2015

(65) Prior Publication Data

US 2016/0300873 A1     Oct. 13, 2016

(30) Foreign Application Priority Data

Apr. 13, 2015   (KR) .................. 10-2015-0051960

(51) Int. Cl.
| | | |
|---|---|---|
| *H01L 27/00* | (2006.01) | |
| *H01L 27/146* | (2006.01) | |
| *H04N 5/369* | (2011.01) | |
| *H04N 5/378* | (2011.01) | |

(52) U.S. Cl.
CPC ..... *H01L 27/14641* (2013.01); *H04N 5/3698* (2013.01); *H04N 5/378* (2013.01); *H01L 27/14645* (2013.01)

(58) Field of Classification Search
CPC . H04N 5/378; H04N 5/3698; H01L 27/14609
See application file for complete search history.

(56) References Cited

U.S. PATENT DOCUMENTS

| | | | | |
|---|---|---|---|---|
| 2010/0053389 A1* | 3/2010 | Matsuura | ............... | H04N 5/355 348/294 |
| 2012/0132786 A1* | 5/2012 | Mori | ...................... | H04N 5/355 250/208.1 |
| 2014/0184316 A1* | 7/2014 | Chou | ..................... | H04N 5/378 327/534 |
| 2014/0263966 A1* | 9/2014 | Hikosaka | ............. | H04N 5/3745 250/208.1 |

FOREIGN PATENT DOCUMENTS

| | | |
|---|---|---|
| JP | 2000-115642 | 4/2000 |
| KR | 1020130072804 | 7/2013 |

\* cited by examiner

*Primary Examiner* — Thanh Luu
(74) *Attorney, Agent, or Firm* — IP & T Group LLP

(57) ABSTRACT

Disclosed are a pixel amplification apparatus and a CMOS image sensor thereof. The pixel amplification apparatus includes a pixel bias sampling unit that samples a first pixel bias voltage, a pixel bias current supply unit that supplies an output node of a pixel signal with a first pixel bias current based on a sampled bias voltage outputted from the pixel bias sampling unit, and a pixel bias current adding unit that additionally supplies the output node with a second pixel bias current in response to a second pixel bias voltage and a period control signal.

11 Claims, 7 Drawing Sheets

PIXEL AMPLIFICATION APPARATUS, CMOS IMAGE SENSOR INCLUDING THE SAME AND OPERATION METHOD THEREOF

CROSS-REFERENCE TO RELATED APPLICATIONS

The present application claims priority of Korean Patent Application No. 10-2015-0051960, filed on Apr. 13, 2015, which is incorporated herein by reference in its entirety.

BACKGROUND

1. Field

Various embodiments of the present invention relate to an image sensor, and more particularly, to a pixel signal read-out technology in a CMOS image sensor.

2. Description of the Related Art

Complementary metal oxide semiconductor (CMOS) image sensors need to have high speed and high density and therefore difficult to secure sufficient time for reading out pixel data.

Specifically, a transmission of image data (i.e., pixel data), outputted from a pixel array, to an analog-to-digital converter (ADC) with correlated double sampling (CDS) scheme takes long time.

FIG. 1 is a diagram illustrating a conventional pixel of a CMOS image sensor. FIG. 1 illustrates the structure of a 4-transistor pixel of the CMOS image sensor, which is a well-known art.

As illustrated in FIG. 1, in the conventional pixel structure, a voltage accumulated in a photodiode (PD) is transferred to a floating diffusion node FD, which is an input node (i.e., a gate terminal) of a pixel source follower M2 and M3, through a transfer transistor M1 in response to a transfer signal TX. The voltage transferred to the floating diffusion node FD changes an output voltage of the pixel source follower M2 and M3, which corresponds to the output of a pixel. For reference, a reset transistor M4 resets the voltage of the floating diffusion node FD in response to a reset signal RX, and a selection transistor M3 outputs the output voltage to a pixel output node VPXO, in response to a selection signal SX.

However, since many pixels included in a pixel array are coupled to one pixel output node, loading capacitance is relatively great, and as the pixel density of a CMOS image sensor increases, the loading capacitance also increases.

Due to such loading capacitance, much pixel conversion time is required to transfer the voltage of the floating diffusion node FD to an analog-to-digital converter.

As a frame per second (FPS), i.e., the number of image frames per second of a CMOS image sensor and pixel density increase, the pixel conversion time becomes insufficient.

When the pixel conversion time is insufficient, a pixel signal may not be transferred correctly to the analog-to-digital converter, and thus a noise may occur in the CMOS image sensor.

SUMMARY

Various embodiments of the present invention are directed to a pixel amplification apparatus for dynamically controlling the amount of a pixel bias current when sampling a pixel bias voltage, a CMOS image sensor including the same and an operation method thereof.

In accordance with an embodiment of the present invention, a pixel amplification apparatus may include: a pixel bias sampling unit suitable for sampling a first pixel bias voltage; a pixel bias current supply unit suitable for supplying an output node of a pixel signal with a first pixel bias current based on the sampled bias voltage; and a pixel bias current adding unit suitable for additionally supplying the output node with a second pixel bias current based on a second pixel bias voltage and a period control signal.

The pixel bias current adding unit may include: a switching section suitable for enabling a pixel bias current addition supply path based on the period control signal; and a current addition supply section suitable for additionally supplying the second pixel bias current based on the second pixel bias voltage as the pixel bias current addition supply path is enabled by the switching section.

An amount of the second pixel bias current may be controlled based on a level of the second pixel bias voltage.

The pixel bias current adding unit additionally may supply the second pixel bias current for an initial period of a pixel signal transmission operation.

In the pixel signal transmission operation, a photodiode included in a pixel transfers a voltage corresponding to incident light to a floating diffusion node based on a transfer signal.

The initial period corresponds to a period up to a setting time point of an output voltage of a pixel source follower included in a pixel from an activation time point of the transfer signal.

In accordance with an embodiment of the present invention, a CMOS image sensor may include: a pixel array suitable for outputting a pixel signal corresponding to incident light; a pixel bias voltage generation unit suitable for generating first and second pixel bias voltages; a pixel amplification apparatus suitable for supplying an output node of the pixel signal with a first pixel bias current corresponding to the first pixel bias voltage, and additionally supplying the output node with a second pixel bias current corresponding to the second pixel bias voltage based on a period control signal; and a read-out processing unit suitable for reading out the pixel signal from the pixel amplification apparatus to output as a pixel data.

The pixel amplification apparatus may include: a pixel bias sampling unit suitable for sampling the first pixel bias voltage; a pixel bias current supply unit suitable for supplying the output node with the first pixel bias current based on a sampled bias voltage; and a pixel bias current adding unit suitable for additionally supplying the output node with a second pixel bias current corresponding to the second pixel bias voltage based on the period control signal.

The pixel bias current adding unit may include: a switching section suitable for enabling a pixel bias current addition supply path based on the period control signal; and a current addition supply section suitable for additionally supplying the second pixel bias current corresponding to the second pixel bias voltage as the pixel bias current addition supply path is enabled by the switching section.

The pixel bias current adding unit additionally may supply the second pixel bias current for an initial period of a pixel signal transmission operation.

In the pixel signal transmission operation, a photodiode included in a pixel may transfer a voltage corresponding to incident light to a floating diffusion node based on a transfer signal.

The initial period corresponds to a period up to a setting time point of an output voltage of a pixel source follower included in a pixel from an activation time point of a transfer signal.

In accordance with an embodiment of the present invention, An operation method of a CMOS image sensor may include: generating first and second pixel bias voltages; supplying a first pixel bias current, which corresponds to the first pixel bias voltage, to a output node of a pixel for a unit row time; additionally supplying a second pixel bias current, which corresponds to the second pixel bias voltage, to the output node during an initial period of pixel signal transmission operation; and reading out a pixel signal of the output node to output as a pixel data.

DETAILED DESCRIPTION

Figure 1:
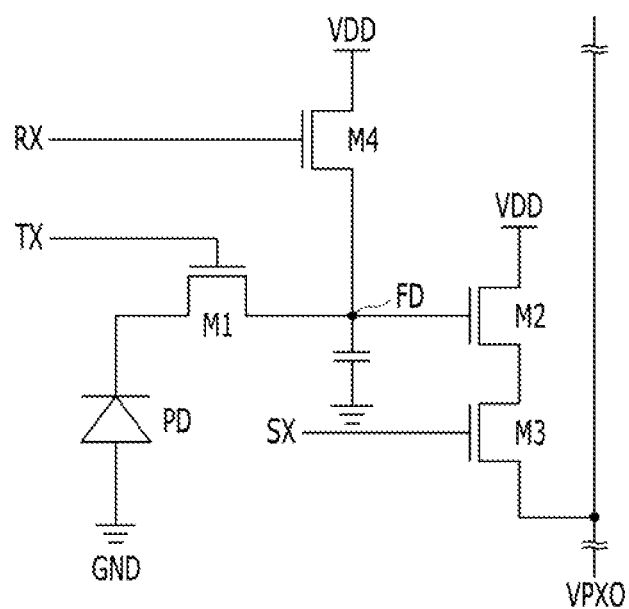
FIG. 1 is a diagram illustrating a conventional pixel of a CMOS image sensor.

Various embodiments will be described below in more detail with reference to the accompanying drawings. The present invention may, however, be embodied in different forms and should not be construed as limited to the embodiments set forth herein. Rather, these embodiments are provided so that this disclosure be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
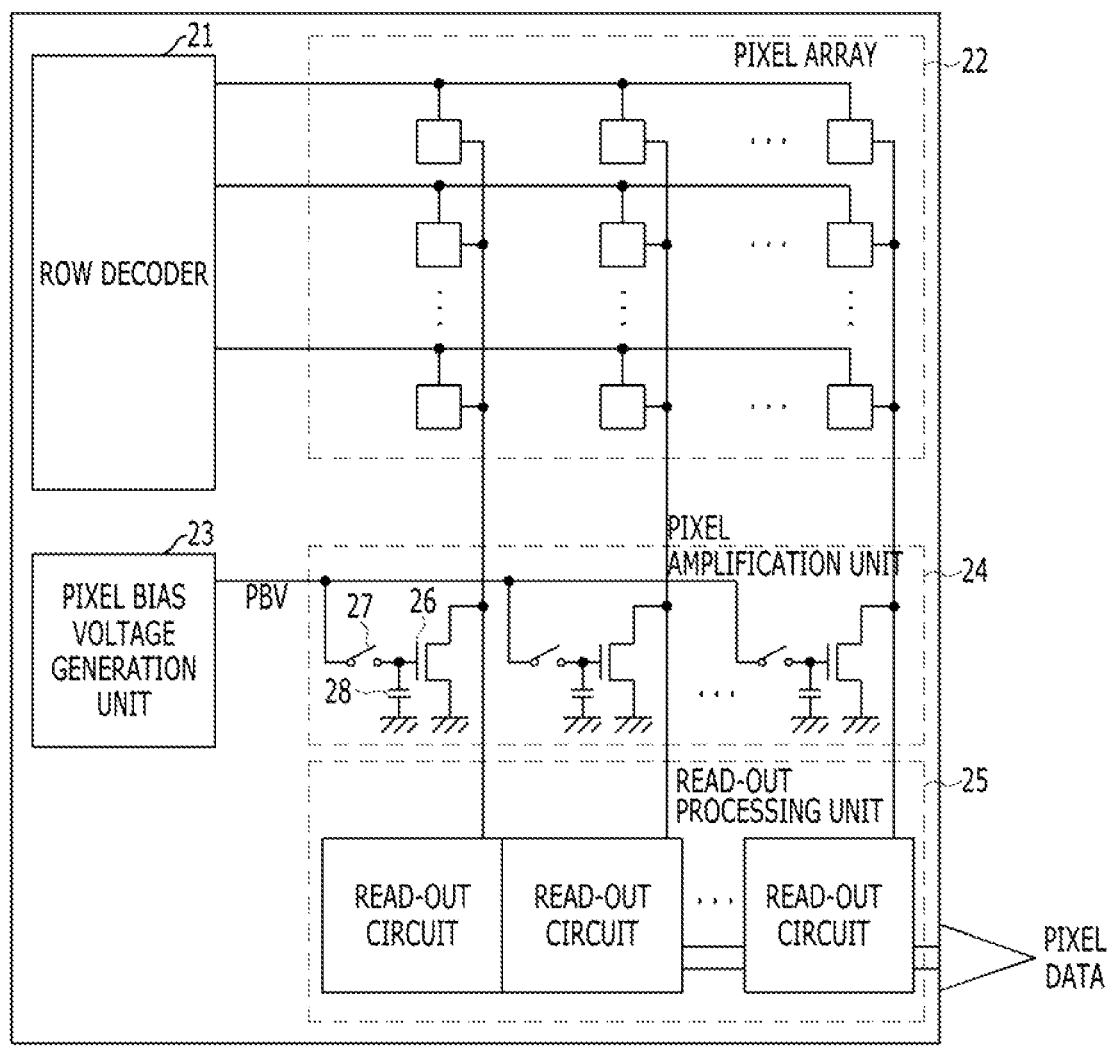
FIG. 2 is a diagram illustrating a CMOS image sensor using a local bias sampling scheme.
Figure 3:
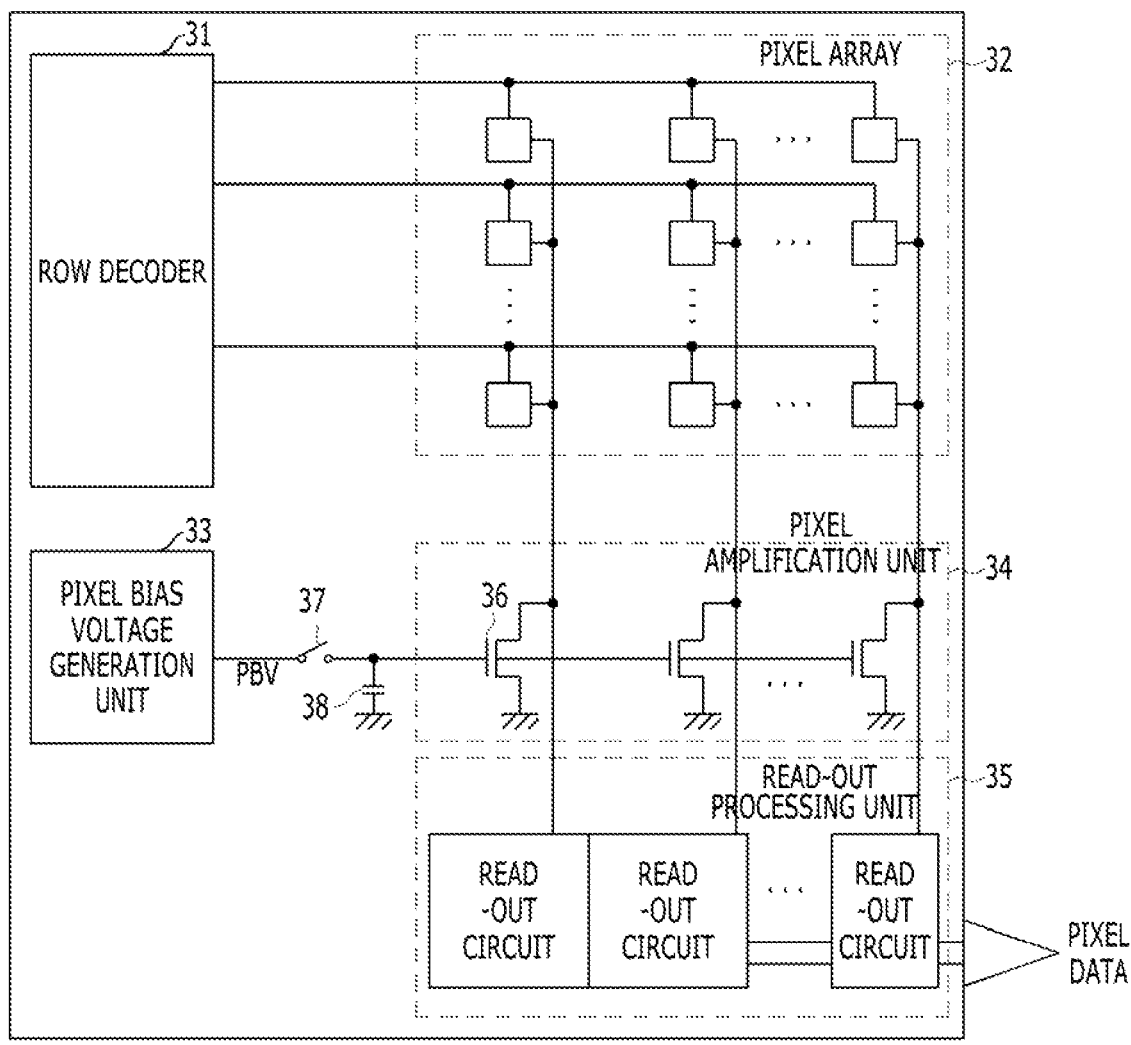
FIG. 3 is a diagram illustrating a CMOS image sensor using a in global bias sampling scheme.

FIG. 2 is a diagram illustrating a CMOS image sensor using a local bias sampling scheme, and FIG. 3 is a diagram illustrating a CMOS image sensor using a global bias sampling scheme.

Referring to FIGS. 2 and 3, the CMOS image sensor includes a row decoder 21 or 31, a pixel array 22 or 32, a pixel bias voltage generation unit 23 or 33, a pixel amplification unit 24 or 34, and a read-out processing unit 25 or 35.

The row decoder 21 or 31 selects pixels according to row lines and controls the operations of the pixel array 22 or 32.

The pixel array 22 or 32 includes a plurality of pixels to sense incident light, and generates pixel signals corresponding to the sensed light. A pixel that is selected among the pixels included in the pixel array 22 or 32 and driven by the row decoder outputs a pixel signal. The pixel signal is an analog pixel signal (i.e., an electric signal) and includes a reset voltage and a pixel signal voltage.

The pixel bias voltage generation unit 23 or 33 generates pixel bias voltage PBV and applies the pixel bias voltage PBV to pixel bias transistors (referred to as load transistors) 26 or 36 of the pixel amplification unit 24 or 34.

The pixel amplification unit 24 or 34 amplifies the pixel signals from the pixel array 22 or 32 and transfers the amplified pixel signals to the read-out processing unit 25 or 35.

The read-out processing unit 25 or 35 reads out the amplified pixel signals, and outputs the read-out data as pixel data. The read-out processing unit 25 or 35 converts the pixel signals (i.e., the analog signals) into digital signals and reads out the digital signals. To this end, the read-out processing unit 25 or 35 includes a plurality of read-out circuits corresponding to the respective columns. Furthermore, the read-out processing unit 25 or 35 may include a ramp signal generator, a plurality of comparators, a plurality of counters, a plurality of latches, a column address decoder, a sense amplifier and the like. Each of the read-out circuits may include a corresponding comparator, a corresponding counter and a corresponding latch.

The pixel bias voltages applied to the pixel bias transistor 26 or 36 of the pixel amplification unit 24 or 34 is directly supplied from the pixel bias voltage generation unit 23 or 33. Accordingly, image quality may be deteriorated because of circuit noise generated from the bias voltage generation unit 23 or 33 is applied to the bias transistors 26 or 36 along with the bias voltage PBV. The pixel amplification unit 24 or 34 includes a plurality of bias transistors 26 or 36 corresponding to the respective columns.

To prevent such deterioration of image quality due to the noise, a local bias sampling scheme or a global bias sampling scheme is used. In the local bias sampling scheme, a sampling switch 27 and a sampling capacitor 28 correspond to the respective column of the pixel amplification unit 24 (see FIG. 2). In the global bias sampling scheme, one sampling switch 37 and one sampling capacitor 38 are provided for all columns (see FIG. 3).

Figure 4:
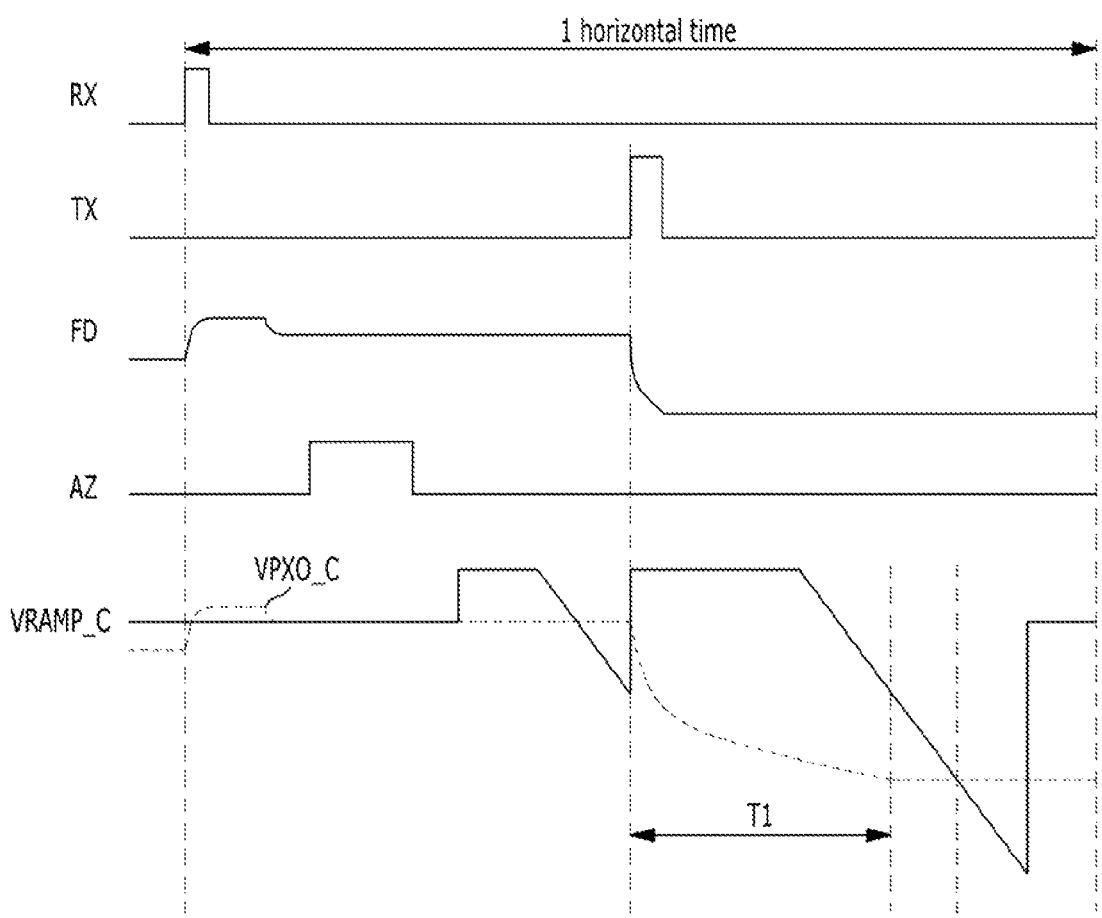
FIG. 4 is a timing diagram for describing an operation of the CMOS image sensor.

FIG. 4 is a timing diagram for describing an operation of a CMOS image sensor.

Referring to FIGS. 1 and 4, when voltage accumulated in the photodiode PD is transferred to a floating diffusion node FD, which is an input node of a pixel source follower M2 and M3, in response to the transfer signal TX signal, a voltage of the pixel output node VPXO is changed according to the intensity of a pixel signal VPXO_C. For reference, in FIG. 4, 'VRAMP_C' denotes a ramp signal.

However, since many pixels included in the pixel array are coupled to the pixel output node VPXO and loading capacitance is relatively great, much settling time T1 is required to settle an output voltage of the pixel source follower M2 and M3 after the voltage of the photodiode PD is transferred to the floating diffusion node FD.

As described above, when the output voltage of the pixel source follower M2 and M3 is not settled, the pixel signal VPXO_C is not transferred correctly. Particularly, since the amount of the pixel signal VPXO_C, which is not transferred, differs by constant value due to a difference of loading capacitance in each column path, a fixed pattern noise (FPN) of a column direction is generated.

As an FPS of the CMOS image sensor and pixel density increase, a pixel conversion time for transferring the pixel signal VPXO_C to the analog-to-digital converters (ADCs) of the read-out processing unit 25 or 35 becomes insufficient. When the pixel conversion time is insufficient, the pixel signal VPXO_C may not be transferred correctly to the analog-to-digital converter, and thus a noise may occur in the CMOS image sensor To resolve the concerns of the generation of the noise due to the insufficient pixel conversion time, a pixel bias (i.e., a bias for the pixel source follower) current may be increased. However, the increased pixel bias current may result in an increase in the power consumption of the CMOS image sensor.

In this regard, in an embodiment of the present invention, the pixel bias current is increased only in a period in which the pixel signal VPXO_C is transferred, so that the pixel conversion time is shortened while minimizing an increase in the power consumption of the CMOS image sensor.

Meanwhile, to remove noises introduced from the pixel bias voltage generation unit 23 or 33, the input node of the pixel bias voltage is sampled. However, when the input node is sampled, it is difficult to increase the pixel bias current only in a specific period.

In this regard, in an embodiment of the present invention, a pixel bias sampling function for removing a noise is used and the amount of the pixel bias current is dynamically controlled such that the pixel bias current is increased only in the period in which the pixel signal is transferred, which will be described in detail with reference to FIGS. 5 and 6.

Figure 5:
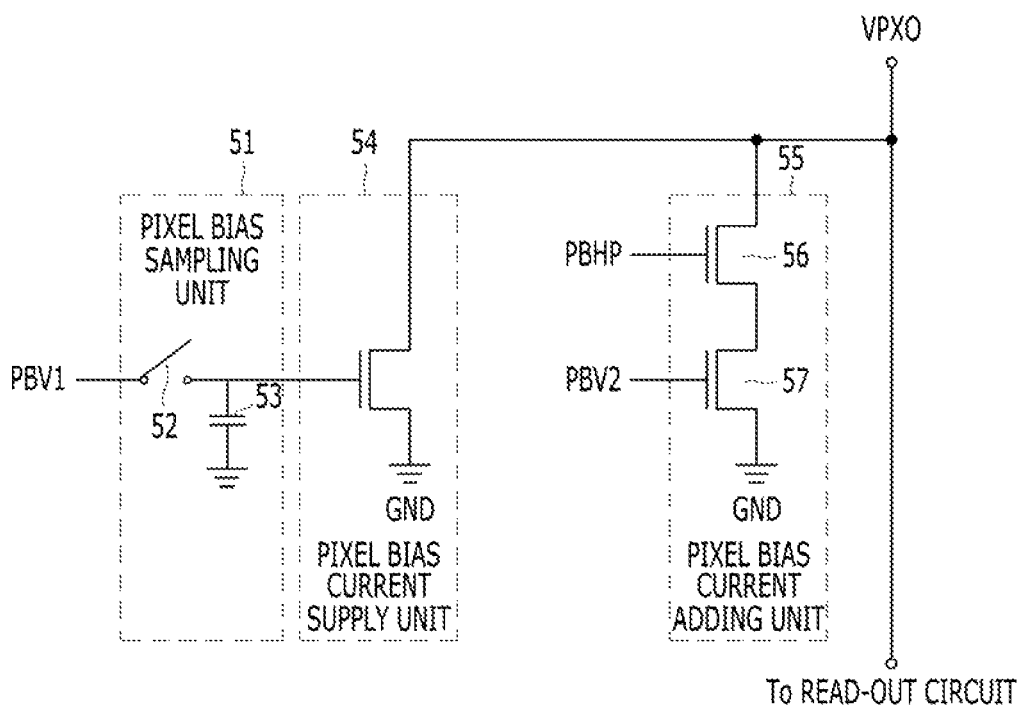
FIG. 5 is a diagram of a pixel amplification apparatus in accordance with an embodiment of the present invention.

FIG. 5 is a diagram of a pixel amplification apparatus with a current control function in accordance with an embodiment of the present invention.

As illustrated in FIG. 5 the pixel amplification apparatus may include a pixel bias sampling unit 51, a pixel bias current supply unit 54, and a pixel bias current adding unit 55.

The pixel bias sampling unit 51 samples a first pixel bias voltage PBV1. The pixel bias current supply unit 54 supplies an output node VPXO of a pixel signal with a first pixel bias current corresponding to the pixel bias voltage (hereinafter, referred to as a "sampled bias voltage") sampled in the pixel bias sampling unit 51. The pixel bias current adding unit 55 additionally supplies the output node VPXO with a second pixel bias current for an initial period (i.e., a period in which the pixel signal is transferred), according to a second pixel bias voltage PBV2 and a period control signal PBHP. The period control signal PBHP is activated during an initial period of pixel signal transmission operation.

The pixel bias sampling unit 51 may sample the first pixel bias voltage PBV1 from a pixel bias voltage generation unit (73 of FIG. 7) to generates the sampled bias voltage, and apply the sampled bias voltage to the pixel bias current supply unit 54. For example, the pixel bias sampling unit 51 may include one sampling switch 52 and one sampling capacitor 53. The sampling switch 52 may be turned on/off according to a control signal from an external control unit (for example, a timing generator).

The pixel bias current supply unit 54 may include an nMOS transistor having a gate terminal receiving the sampled bias voltage, and a drain terminal and a source terminal coupled between the output node VPXO of a pixel source follower and a ground power source.

Figure 7:
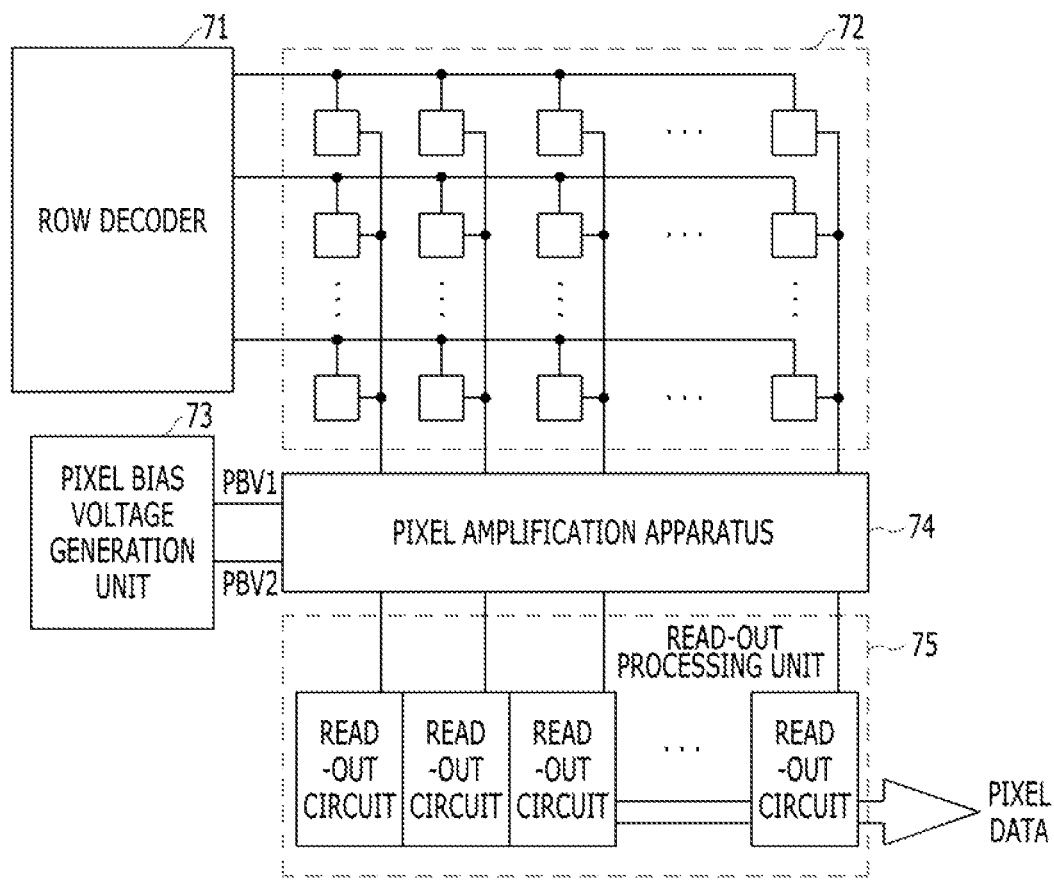
FIG. 7 is a diagram illustrating a CMOS image sensor accordance with an embodiment of the present invention.

The pixel bias current adding unit 55 includes a switching section 56 that enables a pixel bias current addition supply path for the initial period, according to the period control signal PBHP, and a current addition supply section 57 that additionally supplies the output node VPXO with the second pixel bias current according to the second pixel bias voltage PBV2 from the pixel bias voltage generation unit 73 of FIG. 7) as the pixel bias current addition supply path is enabled by the switching section 56. The level of the second pixel bias voltage PBV2 is adjusted, so that it is possible to dynamically control the amount of the second pixel bias current.

The switching section 56 may be realized by a switch transistor that is turned on/off according to the period control signal PBHP. The period control signal PBHP allows the pixel bias current addition supply path to be enabled on only for the initial period. The current addition supply section 57 may be realized by a transistor for current addition that operates by receiving the second pixel bias voltage PBV2 through a gate terminal thereof and additionally supplies the second pixel bias current.

The switch transistor may be an nMOS transistor having a drain terminal coupled to the output node of the pixel source follower, a gate terminal receiving the period control signal PBHP, and a source terminal coupled to a drain terminal of the transistor for current addition. The transistor for current addition may be an nMOS transistor having a drain terminal coupled to the source terminal of the switch transistor, a gate terminal coupled to the second pixel bias voltage PBV2, and a source terminal coupled to the ground power source.

As described above, in the embodiment of the present invention, the path of the pixel bias current is divided into two paths. The first path including the pixel bias sampling unit 51 and the pixel bias current supply unit 54 has substantially the same configuration as that of a conventional circuit to perform a pixel bias sampling function of removing a noise, and provides the first pixel bias current to the output node VPXO of the pixel source follower.

The second path including the pixel bias current adding unit 55 performs a function of increasing an entire pixel bias current formed at the output node VPXO only in a specific period, that is, the initial period in which the pixel signal is transferred. The pixel bias current adding unit 55 of the second path may be realized by adding the switch transistor and the transistor for current addition to the conventional pixel bias circuit (i.e., the first path). In the embodiment of the present invention, the switch transistor is controlled according to the period control signal PBHP to operate the transistor for current addition such that the pixel bias current is additionally applied only in the initial period in which the pixel signal is transferred to an input node of an analog-to-digital converter, so that the pixel conversion time is reduced. In the other periods, the second path is electrically separated from the pixel output node, so that noise introduction is substantially prevented.

As described above, in the embodiment of the present invention, it is possible to effectively reduce the pixel conversion time while substantially maintaining the pixel bias sampling function for noise removal performed in the existing pixel bias circuit. That is, it is possible to reduce the pixel conversion time by dynamically controlling the amount of the pixel bias current while substantially preventing noise introduction by substantially maintaining the pixel bias sampling function.

Figure 6:
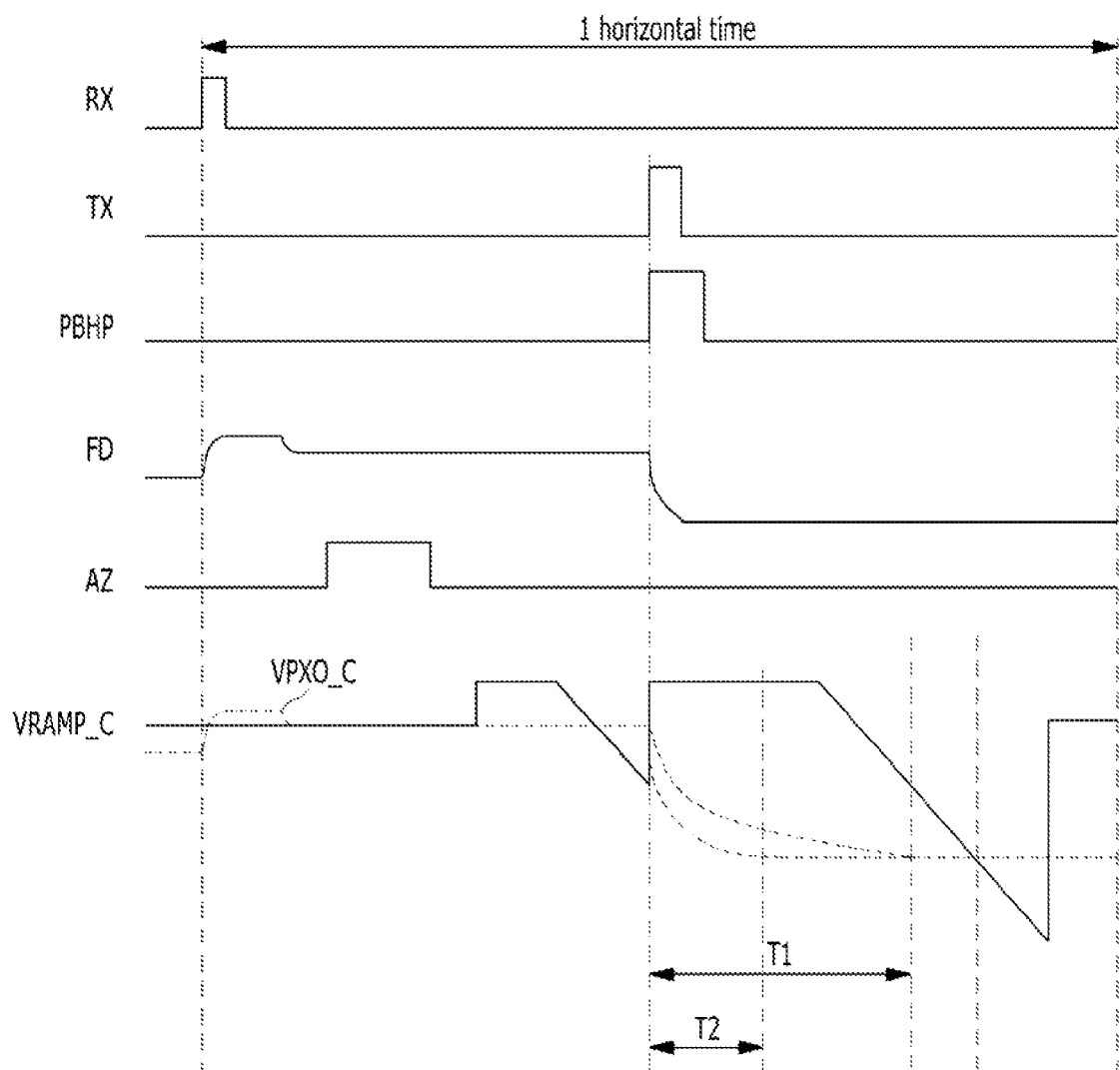
FIG. 6 is a timing diagram for describing an operation of a CMOS image sensor including the pixel amplification apparatus shown in FIG. 5.

FIG. 6 is a timing diagram an operation of a CMOS image sensor including the pixel amplification apparatus shown in FIG. 5.

As illustrated in FIG. 6, when the transfer signal TX signal is activated, the pixel signal transmission operation during which the data of the photodiode PD is transferred to the floating diffusion node FD begins. By using the period control signal PBHP, the pixel bias current adding unit 55 of the second path is enabled only in the initial period of the pixel signal transmission operation. The initial period may correspond to a period up to the settling time point of the pixel source follower output voltage from the operation time point of the transfer signal. FD Accordingly, it is possible to reduce the settling time T2 of the output voltage VPXO_C of the pixel source follower.

FIG. 7 is a diagram illustrating a CMOS image sensor in accordance with the embodiment of the present invention.

As illustrated in FIG. 7, the CMOS image sensor may include a row decoder 71, a pixel array 72, the pixel bias voltage generation unit 73, a pixel amplification apparatus 74, and a read-out processing unit 75.

The row decoder 71 selects pixels according to row lines and controls the operation of the pixel array 72.

The pixel array 72 includes a plurality of pixels to sense incident light, and generates pixel signals corresponding to the sensed light. A pixel that is selected among the pixels included in the pixel array 72 and driven by the row decoder 71 outputs a pixel signal. The pixel signal is an analog pixel signal (i.e., an electric signal) and includes a reset voltage and a pixel signal voltage.

The pixel bias voltage generation unit 73 generates the first and second pixel bias voltages PBV1 and PBV2 and applies the first and second pixel bias voltages PBV1 and PBV2 to a pixel bias transistor and a transistor for current addition of the pixel amplification apparatus 74.

The pixel amplification apparatus 74 may supply the first pixel bias current to the output node VPXO based on the first pixel bias voltage PBV1, and additionally supply the second pixel bias current to the output node VPXO only in the initial period, based on the second pixel bias voltage PBV2 and the period control signal PBHP.

The read-out processing unit 75 reads out the pixel signal from the pixel amplification unit 74, and outputs the read-out data as pixel data. The read-out processing unit 75 converts the pixel signal into a digital signal and reads out the digital signal. To this end, the read-out processing unit 75 includes a plurality of read-out circuits corresponding to the respective columns. Furthermore, the read-out processing unit 75 may include a ramp signal generator, a plurality of comparators, a plurality of counters, a plurality of latches, a column address decoder, a sense amplifier and the like. Each of the read-out circuits may include a corresponding comparator, a corresponding counter and a corresponding latch.

Referring again to FIG. 6, the pixel array 72 may output the reset voltage as a pixel signal VPXO_C in response to a reset signal RX for a reset period of a unit row time (i.e., 1 horizontal time). At this time, the pixel amplification apparatus 74 may supply the output node VPXO with the first pixel bias current corresponding to the first pixel bias voltage PBV1. In more detail, the pixel bias current supply unit 54 may provide the output node VPXO with the first pixel bias current based on a sampled bias voltage obtained by sampling the first pixel bias voltage PBV1. Furthermore, the pixel bias current adding unit 55 may be disabled in response to the period control signal PBHP. In other words, the pixel bias current adding unit 55 may electrically separate the output node VPXO from the ground power source according to a deactivated period control signal PBHP, thereby substantially preventing the second pixel bias current from being additionally supplied to the output node VPXO. Accordingly, a noise, which may be introduced to the output node VPXO through the pixel bias current adding unit 55, may be blocked.

Furthermore, the pixel array 72 may output the pixel signal voltage as the pixel signal VPXO_C in response to a transfer signal TX during a signal period of 1 horizontal time. The pixel amplification apparatus 74 may additionally supply the output node VPXO with the second pixel bias current corresponding to the second pixel bias voltage PBV2 while the first pixel bias current is being supplied to the output node VPXO. In more detail, the pixel bias current supply unit 54 may continuously provide the output node VPXO with the first pixel bias current based on the sampled bias voltage. The pixel bias current adding unit 55 may be enabled in response to the period control signal PBHP. That is, the pixel bias current adding unit 55 may electrically connect the output node VPXO to the ground power source according to an activated period control signal PBHP, thereby additionally supplying the second pixel bias current to the output node VPXO. The pixel bias current adding unit 55 may additionally supply the second pixel bias current only in an activation period of the period control signal PBHP. For example, the activation period of the period control signal PBHP is the initial period, and may include an initial period in which the pixel signal voltage is transferred to the output node VPXO. Consequently a time, which is required to transfer the pixel signal voltage to the output node VPXO, that is, the setting time is reduced as compared with the general CMOS image sensors (FIGS. 2 and 3).

The read-out processing unit 75 may generate pixel data based on the reset voltage and the pixel signal voltage sequentially transferred to the output node VPXO.

Although various embodiments have been described for illustrative purposes, it will be apparent to those skilled in the art that various changes and modifications may be made without departing from the spirit and scope of the invention as defined in the following claims.

What is claimed is:

1. A pixel amplification apparatus comprising:
a pixel bias sampling unit suitable for sampling a first pixel bias voltage which is generated from a pixel bias voltage generation unit;
a pixel bias current supply unit suitable for supplying an output node of a pixel signal with a first pixel bias current based on the sampled bias voltage; and
a pixel bias current adding unit suitable for additionally supplying the output node with a second pixel bias current based on a second pixel bias voltage, directly provided from the pixel bias voltage generation unit, and a period control signal, wherein the pixel bias current supply unit and the pixel bias current adding unit are coupled to each other in parallel.

2. The pixel amplification apparatus of claim 1, wherein the pixel bias current adding unit comprises:
a switching section suitable for enabling a pixel bias current addition supply path based on the period control signal; and
a current addition supply section suitable for additionally supplying the second pixel bias current based on the second pixel bias voltage as the pixel bias current addition supply path is enabled by the switching section.

3. The pixel amplification apparatus of claim 1, wherein an amount of the second pixel bias current is controlled based on a level of the second pixel bias voltage.

4. The pixel amplification apparatus of claim 1, wherein the pixel bias current adding unit additionally supplies the second pixel bias current for an initial period of a pixel signal transmission operation.

5. The pixel amplification apparatus of claim 4, wherein, in the pixel signal transmission operation, a photodiode included in a pixel transfers a voltage corresponding to incident light to a floating diffusion node based on a transfer signal.

6. The pixel amplification apparatus of claim 5, wherein the initial period corresponds to a period up to a setting time point of an output voltage of a pixel source follower included in a pixel from an activation time point of the transfer signal.

7. A CMOS image sensor comprising:
 a pixel array suitable for outputting a pixel signal corresponding to incident light;
 a pixel bias voltage generation unit suitable for generating first and second pixel bias voltages;
 a pixel amplification apparatus suitable for supplying an output node of the pixel signal with a first pixel bias current corresponding to the first pixel bias voltage, and additionally supplying the output node with a second pixel bias current corresponding to the second pixel bias voltage based on a period control signal; and
 a read-out processing unit suitable for reading out the pixel signal from the pixel amplification apparatus to output as a pixel data,
 wherein the pixel amplification apparatus comprises:
  a pixel bias sampling unit suitable for sampling the first pixel bias voltage which is generated from the pixel bias voltage generation unit;
  a pixel bias current supply unit suitable for supplying the output node with the first pixel bias current based on a sampled bias voltage; and
  a pixel bias current adding unit suitable for additionally supplying the output node with a second pixel bias current corresponding to the second pixel bias voltage, directly provided from the pixel bias voltage generation unit, based on the period control signal, wherein the pixel bias current supply unit and the pixel bias current adding unit are coupled to each other in parallel.

8. The CMOS image sensor of claim 7, wherein the pixel bias current adding unit comprises:
 a switching section suitable for enabling a pixel bias current addition supply path based on the period control signal; and
 a current addition supply section suitable for additionally supplying the second pixel bias current corresponding to the second pixel bias voltage as the pixel bias current addition supply path is enabled by the switching section.

9. The CMOS image sensor of claim 7, wherein the pixel bias current adding unit additionally supplies the second pixel bias current for an initial period of a pixel signal transmission operation.

10. The CMOS image sensor of claim 9, wherein, in the pixel signal transmission operation, a photodiode included in a pixel transfers a voltage corresponding to incident light to a floating diffusion node based on a transfer signal.

11. The CMOS image sensor of claim 10, wherein the initial period corresponds to a period up to a setting time point of an output voltage of a pixel source follower included in a pixel from an activation time point of a transfer signal.

* * * * *